(12) United States Patent
Liu et al.

(10) Patent No.: US 10,121,805 B2
(45) Date of Patent: Nov. 6, 2018

(54) SEMICONDUCTOR STRUCTURE AND METHOD FOR MANUFACTURING THE SAME

(71) Applicant: TAIWAN SEMICONDUCTOR MANUFACTURING COMPANY LTD., Hsinchu (TW)

(72) Inventors: Ming-Chyi Liu, Hsinchu (TW); Yu-Hsing Chang, Taipei (TW); Yung-Chang Chang, Taipei (TW); Shih-Chang Liu, Kaohsiung County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/454,610

(22) Filed: Mar. 9, 2017

(65) Prior Publication Data

US 2018/0261636 A1 Sep. 13, 2018

(51) Int. Cl.
| | | |
|---|---|---|
| H01L 31/0328 | (2006.01) | |
| H01L 27/144 | (2006.01) | |
| H01L 27/146 | (2006.01) | |
| H01L 31/036 | (2006.01) | |
| H01L 31/028 | (2006.01) | |
| H01L 31/0232 | (2014.01) | |
| H01L 31/18 | (2006.01) | |

(52) U.S. Cl.
CPC .... *H01L 27/1446* (2013.01); *H01L 27/14621* (2013.01); *H01L 27/14627* (2013.01); *H01L 27/14683* (2013.01); *H01L 31/028* (2013.01); *H01L 31/02327* (2013.01); *H01L 31/036* (2013.01); *H01L 31/1808* (2013.01)

(58) Field of Classification Search
CPC .......................... H01L 31/0328; H01L 31/0232
USPC ...................................................... 357/16, 30
See application file for complete search history.

(56) References Cited

U.S. PATENT DOCUMENTS

| | | | | |
|---|---|---|---|---|
| 4,835,575 | A * | 5/1989 | Plihal ................ | G02B 6/12004 257/E31.059 |
| 9,123,606 | B2 * | 9/2015 | Wei ................... | H01L 27/14806 |
| 9,349,770 | B2 * | 5/2016 | Lenchenkov ..... | H01L 27/14649 |
| 9,810,794 | B2 * | 11/2017 | Dahal ....................... | G01T 1/24 |

* cited by examiner

*Primary Examiner* — Mark Prenty
(74) *Attorney, Agent, or Firm* — WPAT. P.C., Intellectual Property Attorneys; Anthony King (57) ABSTRACT

A semiconductor structure is disclosed. The semiconductor substrate includes: a front surface and a back surface; and a heterogeneous radiation-sensing region in the semiconductor substrate, the heterogeneous radiation-sensing region including a top surface, a bottom surface and sidewalls, the top surface being adjacent to the front surface of the semiconductor substrate, the sidewalls being perpendicular to the front surface of the semiconductor substrate, and the bottom surface being parallel to the front surface of the semiconductor substrate. An associated manufacturing method is also disclosed.

20 Claims, 9 Drawing Sheets

SEMICONDUCTOR STRUCTURE AND METHOD FOR MANUFACTURING THE SAME

BACKGROUND

Integrated circuit (IC) technologies are constantly being improved. Such improvements frequently involve scaling down device geometries to achieve lower fabrication costs, higher device integration density, higher speeds, and better performance.

One type of IC device is an image sensor device. The image sensor device includes a pixel grid for detecting light and recording intensity (brightness) of the detected light. The pixel grid responds to the light by accumulating charges. The charges can be used (for example, by other circuitry) to provide color in some suitable applications, such as a digital camera.

Common types of pixel grids include a charge-coupled device (CCD) image sensor or complimentary metal-oxide-semiconductor (CMOS) image sensor device. One type of image sensor device is a backside illuminated (BSI) image sensor device. BSI image sensor devices are used for sensing a volume of light projected towards a backside surface of a substrate. BSI image sensor devices provide a high fill factor and reduced destructive interference, as compared to front-side illuminated (FSI) image sensor devices. In general, BSI technology provides higher sensitivity, lower cross-talk, and comparable quantum efficiency as compared to FSI image sensor devices.

However, although existing BSI image sensor devices and methods of fabricating these BSI image sensor devices have been generally adequate for their intended purposes, as device downsizing continues, such devices and methods have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. Specifically, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments and configurations discussed.

Further, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating or working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Figure 1:
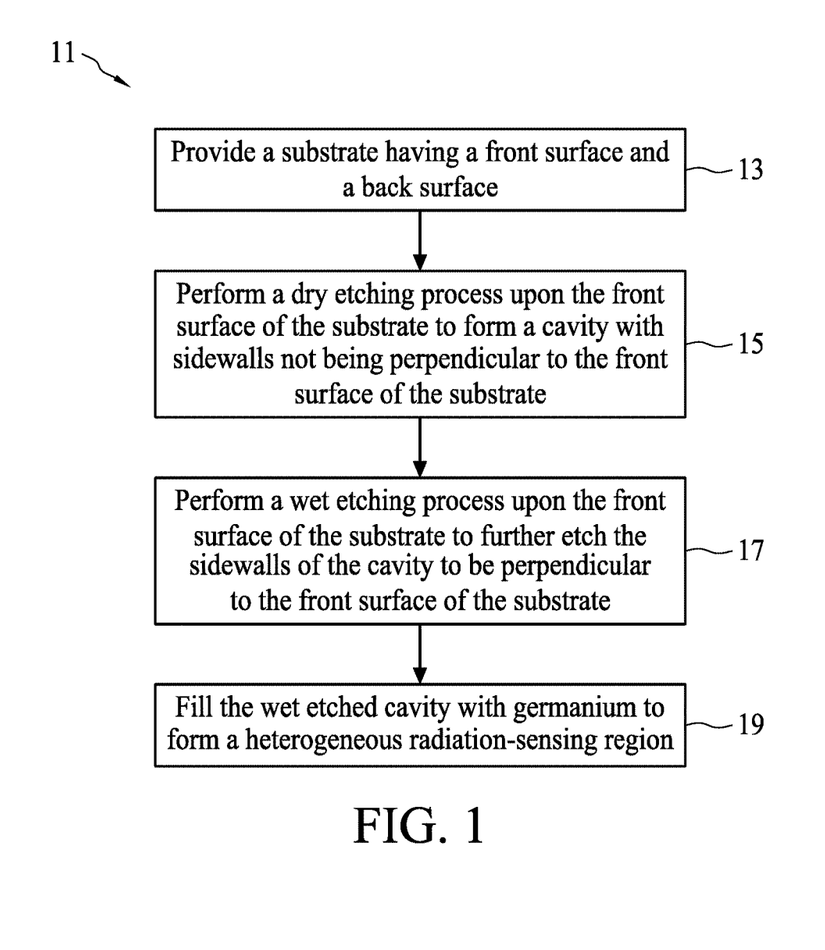
FIG. 1 is a flowchart of a method for fabricating a back-side illuminated (BSI) image sensor device according to various aspects of the present disclosure.

Illustrated in FIG. 1 is a flowchart of a method 11 for fabricating a back-side illuminated (BSI) image sensor device according to various aspects of the present disclosure. Referring to FIG. 1, the method 11 begins with block 13 in which a substrate having a front surface and a back surface is provided. The method 11 continues with block 15 in which a dry etching process is performed upon the front surface of the substrate to form a cavity with sloped sidewalls which are not perpendicular to the front surface of the substrate. The method 11 continues with block 17 in which a wet etching process is performed upon the front surface of the substrate to further etch the sidewalls of the cavity to be perpendicular to the front surface of the substrate. The method 11 continues with block 19 in which the wet etched cavity is filled with germanium to form a heterogeneous radiation-sensing region. The heterogeneous radiation-sensing region is operable to sense radiation projected toward the heterogeneous radiation-sensing region from the back surface.

FIGS. 2 to 8 are diagrammatic fragmentary cross-sectional side views (except FIG. 4, which is a diagrammatic fragmentary top view with respect to FIG. 3) of a BSI image sensor device 30 at various stages of its fabrication according to an embodiment of the method 11 of FIG. 1. It is understood that FIGS. 2 to 7 have been simplified for a better understanding of the inventive concepts of the present disclosure.

Figure 2:
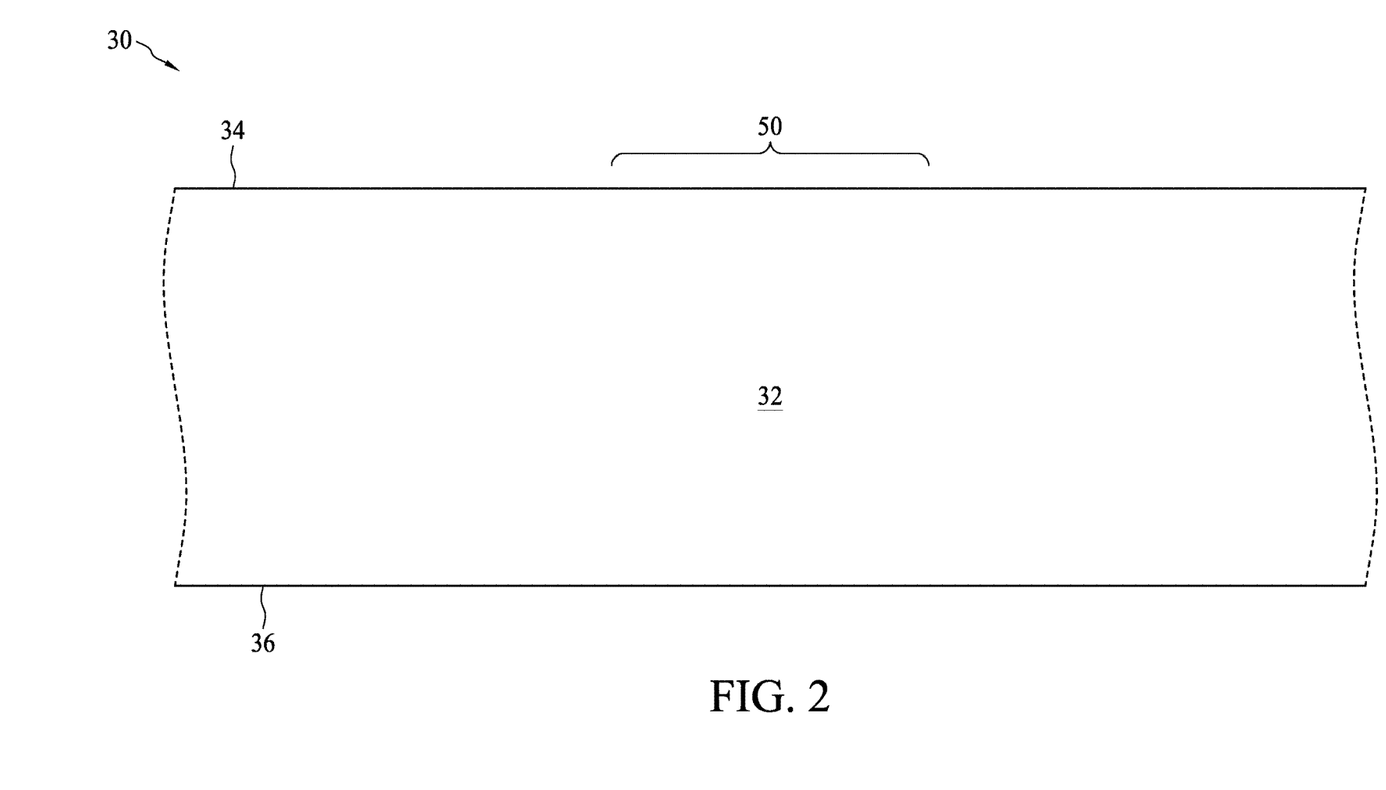
FIGS. 2 to 8 are diagrammatic fragmentary views of a BSI image sensor device at various stages of its fabrication according to an embodiment of the method of FIG. 1.

Referring to FIG. 2, the BSI image sensor device 30 includes a substrate 32, also referred to as a device substrate. The substrate 32 is a silicon substrate, such as a silicon wafer. In the exemplary embodiment, the substrate 32 has a crystal orientation of (110), i.e. the substrate 32 is a Si (110) substrate, such as a Si (110) wafer. The silicon substrate may be doped with a P-type dopant such as boron, in which case the substrate 32 is a P-type substrate. Alternatively, the substrate 32 could be another suitable semiconductor material. For example, the substrate 32 may be a silicon substrate that is doped with an N-type dopant such as phosphorous or arsenic, in which case the substrate 32 is an N-type substrate. The substrate 32 may include other elementary semiconductors such as germanium. The substrate 32 may optionally include a compound semiconductor and/or an alloy semiconductor. Further, the substrate 32 may include an epitaxial layer (epi layer), may be strained for performance enhancement, and may include a silicon-on-insulator (SOI) structure.

The substrate 32 has a front side 34 and a back side 36. The front side 34 may also be referred to as a front surface, and the back side 36 may also be referred to as a back surface. In some embodiments, the substrate 32 may be configured to include various regions, which may include a pixel-array region, a periphery region, a bonding pad region, and a scribe line region. The pixel-array region contains arrays of heterogeneous radiation-sensing pixels. Each pixel may include a heterogeneous radiation-sensing device that can sense or detect radiation having specific wavelengths, which may correspond to lights of different colors. The periphery region includes devices that need to be kept optically dark. These devices may be digital devices, such as application-specific integrated circuit (ASIC) devices or system-on-chip (SOC) devices. The devices in the periphery region may also be reference pixels that are used to establish a baseline of an intensity of light for the image sensor device 30.

The bonding pad region is where one or more bonding pads of the image sensor device 30 are formed. The bonding pads allow electrical connections to be established between the image sensor device 30 and external devices. The scribe line region includes regions that contain boundaries between various adjacent semiconductor dies. The scribe line region is cut therethrough in a later fabrication process to physically separate the adjacent dies, before the dies are packaged and sold as integrated circuit chips. For the sake of simplicity, the periphery region, the bonding pad region, and the scribe line region are not illustrated, and only a portion of the pixel-array region is illustrated in FIG. 2 to FIG. 8 to better focus on the heterogeneous radiation-sensing device. Specifically, FIG. 2 to FIG. 8 illustrate an example pixel 50 of the pixel-array region. It is understood, however, that any number of pixels may be implemented in the pixel-array region, and that these other pixels may be implemented differently from the example pixel 50.

Figure 3:
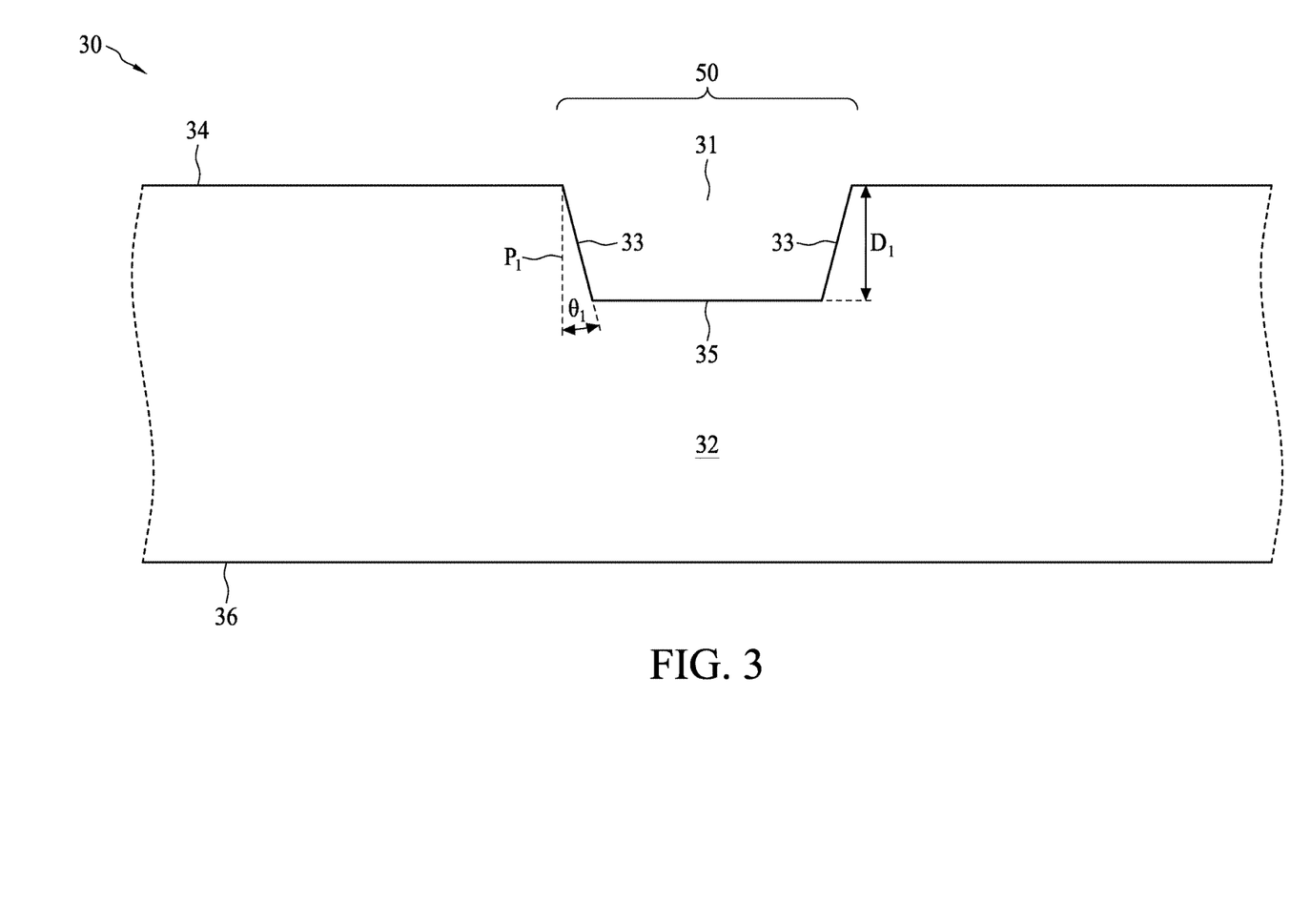
Figure 4:
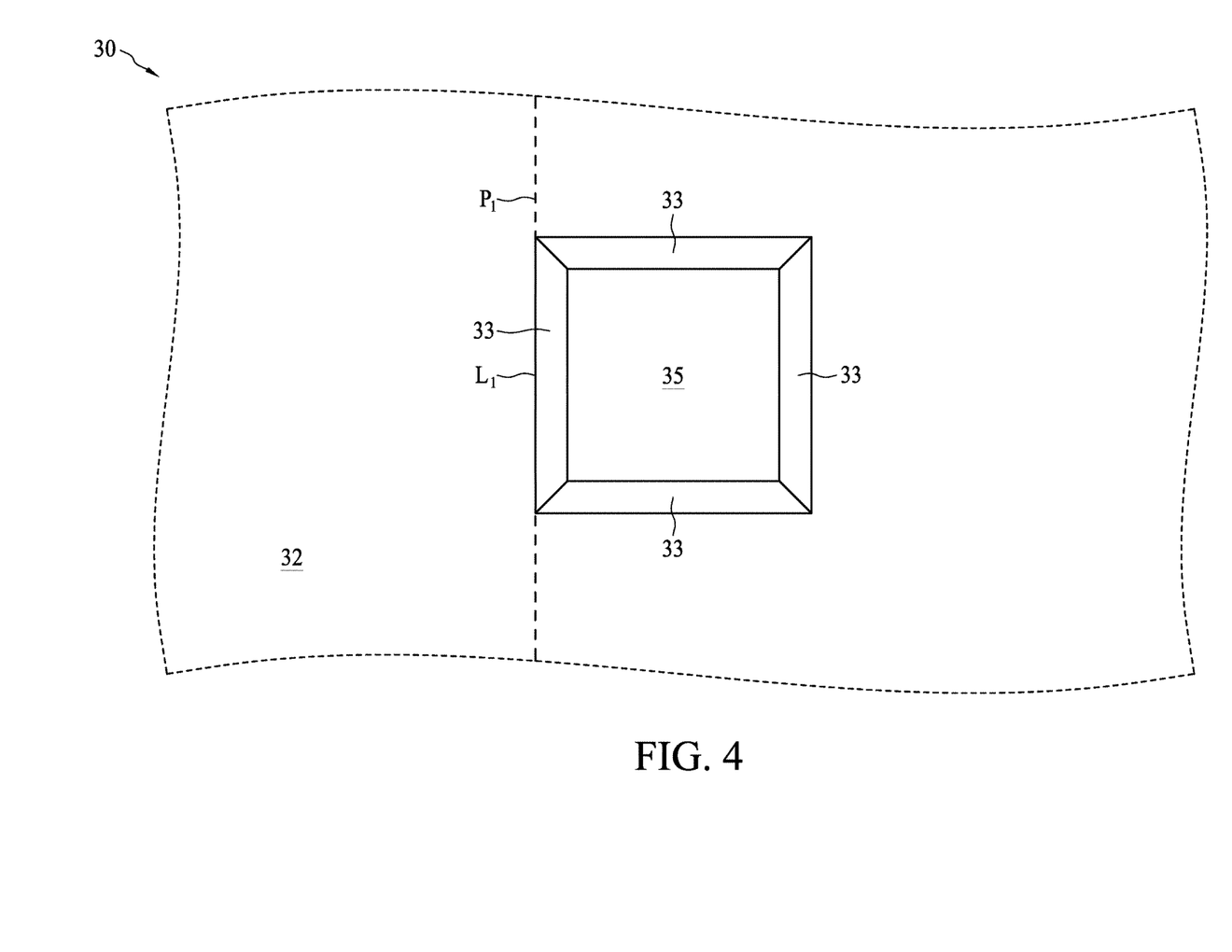

Referring to FIG. 3 and FIG. 4, a dry etching process is performed upon the front surface 34 of the substrate 32 to form a cavity 31. The cavity 31 is substantially a square shaped recess having four sloped sidewalls 33, shown from a top view in FIG. 4. As can be seen in FIG. 3, a bottom surface of the cavity 31 is recessed into the front surface 34 of the substrate 32. The four sidewalls 33 are tapered from the front surface 34 of the substrate 32 toward the back surface 36 of the substrate 32. A plane $P_1$ perpendicular to the front surface 34 of the substrate 32 is provided for reference to facilitate the ensuing discussion. As shown in FIG. 4, the plane $P_1$ intersects a left one of the four sidewalls 33 in a line $L_1$ (marked as a thick line) on the front surface 34 of the substrate 32.

Referring back to FIG. 3 again, the four sidewalls 33 of the cavity 31 are not perpendicular to the front surface 34 of the substrate 32. An angle $\theta_1$ greater than 0 degrees is formed by each of the sidewalls 33 and the plane $P_1$. In existing methods, the etch process stops here and the method continues with heterogeneous radiation-sensing material filling. However, some issues may arise here. One issue arises because, as the cavity 31 is used to define a profile of the heterogeneous radiation-sensing region, the tapered cavity 31 leads to a tapered profile of the heterogeneous radiation-sensing region. The tapered profile of the heterogeneous radiation-sensing region limits the sensing ability of the heterogeneous radiation-sensing region. For example, when light comes from the back surface 36 of the substrate 32, the region between the plane $P_1$ and the left one of the four sidewalls 33 is not available to be used for containing heterogeneous radiation-sensing and the region is wasted. The same situation also exists in other three sidewalls of the four sidewalls 33, and details are not repeated here for the sake of simplicity. Another issue is that the four sidewalls 33 and the bottom 35 of the cavity 31 normally have a rough surface and a plurality of crystal defects after the dry etch. The roughness of the surface of the four sidewalls 33 and the bottom 35 of the cavity 31 induces poor quality of the heterogeneous radiation-sensing material filled thereon during subsequent steps of the method, and thereby affects the light photo response.

The dry etching process may be implemented in an etching chamber. Some process parameters in the dry etching process include a radio frequency (RF) source power, a bias power, an electrode size, a pressure, a flow rate, an etching duration, a wafer temperature, other suitable process parameters, or combinations thereof. The dry etching process implements any suitable gas such as an oxygen-containing gas, fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr, He and/or $CHBR_3$), iodine-containing gas, other suitable gases (Ar and/or $CH_4$), plasmas, and/or combinations thereof. In some embodiments, the dry etching process utilizes an $O_2$ plasma treatment and/or an $O_2/N_2$ plasma treatment. Further, the dry etching process can be performed for a suitable duration under a certain pressure range. Some process parameters such as etching duration and/or etch rate are adjustable to control a depth $D_1$ of the cavity 31.

Figure 5:
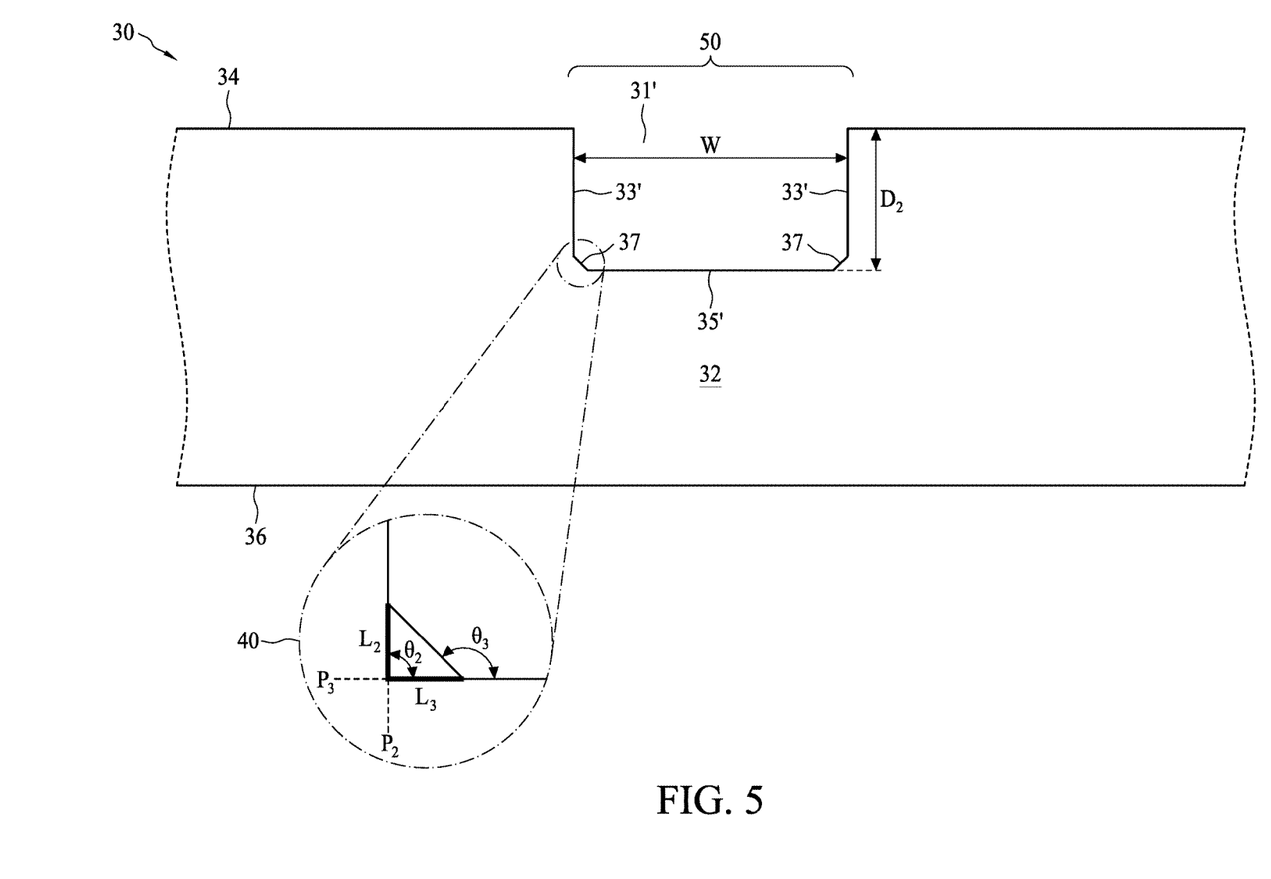

A wet etching process is performed on the cavity 31 in FIG. 3. The etchant may be applied on the front surface 34 of the substrate 32 as well as the sidewalls 33 and the bottom 35 of the cavity 31 in order to improve sensing ability of the heterogeneous radiation-sensing region. During the wet etching process, the cavity 31 is expanded to become a cavity 31' as shown in FIG. 5. One purpose of the wet etching process is to remove a portion of the substrate 32 so as to change a profile of the sidewalls 33 from a tapered tendency (relative to surface 34 and bottom 35) to a complete vertical tendency. In this way, the volume of the heterogeneous radiation-sensing material filled in the subsequent process can be increased to enhance light photo response. Another purpose of the wet etching process is to polish the surface of the sidewalls 33 and the bottom 35. The surface of the cavity 31' with reduced roughness is advantageous for the subsequent heterogeneous radiation-sensing material filling process. Moreover, with the wet etching process, a portion of the substrate 32 at the bottom 35 of the cavity 31 may be further etched away to become a deeper bottom 35' compared to the bottom 35. That is, a depth $D_2$, measured from the surface 34 to the bottom 35', of the cavity 31' is greater than the depth $D_1$, measured from the surface 34 to the bottom 35, of the cavity 31.

A circle 40 in FIG. 5 represents an enlarged portion of a corner of the cavity 31'. The presented sidewalls 33' obtained through the wet etching process are perpendicular to the front surface 34 and the back surface 36 of the substrate 32. With respect to the sidewalls 33', an angle $\theta_2$ is formed. The angle $\theta_2$ is substantially formed by an extended plane $P_2$ of the sidewalls 33' and an extended plane $P_3$ of the bottom 35' of the cavity 33'. In some embodiments, the angle $\theta_2$ is substantially equal to 90 degrees. Please note that the front surface 34, the back surface 36 and the bottom 35' of the Si (110) substrate 32 are in <110> direction. Therefore, the bottom 35' is parallel to the front surface 34 and the back surface 36 of the substrate 32. The sidewalls 33' are in <111> direction and perpendicular to the front surface 34 and the back surface 36 of the Si (110) substrate 32.

Surfaces 37 are slated from the sidewalls 33' to the bottom 35'. The surfaces 37 are formed at four edges of the bottom 35', and the surfaces 37 are adjacent to the sidewalls 33' and the bottom 35' of the cavity 31'. Each of the surfaces 37 is in <100> direction. An angle $\theta_3$ equal to 135 degrees is formed by each of the surfaces 37 and the bottom 35' of the cavity 33'. Each of the surfaces 37, the extended plane $P_2$ and the extended plane $P_3$ together form an isosceles triangle with two sides, $L_2$ and $L_3$ (marked as thick lines), of equal length. The isosceles triangle is a right triangle (right-angled triangle) as well in which the angle $\theta_2$ is a right angle (that is, a 90-degree angle).

A dimension of the surfaces 37, i.e. a dimension of the right isosceles triangle, is not a limitation of the present disclosure. For example, a ratio of the side $L_2$ or $L_3$ to a width W of the cavity 31' may be changed in various embodiments. For another example, a ratio of the side $L_2$ or $L_3$ to the depth $D_2$ of the cavity 31' may be changed in various embodiments. In some embodiments, the depth $D_2$ of the cavity 31' may be greater than about 0 μm and less than about 10 μm. In some other embodiments, the depth $D_2$ of the cavity 31' may be in a range from about 1 μm to about 50 μm.

The etchant of the wet etching process may utilize a wet chemical etchant. In an embodiment, the etchant may be an alkaline solution of ammonia water and aqueous amine. In an embodiment, the etchant may be Tetramethyl ammonium hydroxide (TMAH), tetraethylammonium hydroxide (TEAH), ethylenediamene pyrocatecol (EDP), an alkaline hydroxide such as, for example, KOH, NaOH, CeOH, RbOH, and/or a variety of other etchants known in the art. By using the substrate 32 having a (110) crystal orientation and the wet etching process to form the cavity 31', the direction and propagation of the dislocations may be controlled to better provide the cavity 31' with fewer dislocations on the surface. Structure geometry of the cavity 31', such as the vertical sidewalls, can be obtained since the wet etching process follows the crystal orientation.

The exemplary embodiment described above utilizes two etching processes including an initial dry etching process to roughly obtain the cavity 31, and then a secondary wet etching process to obtain a refined cavity 31'. In some embodiments, the block 15 of the method 11 can alternatively omitted. In the case where the block 15 is omitted, the method 11 is changed to include only the secondary wet etching process. Some process parameters such as etching durations and/or etch rate may be adjustable to ensure that a final cavity the same or similar to the cavity 31' can be obtained.

Figure 6:
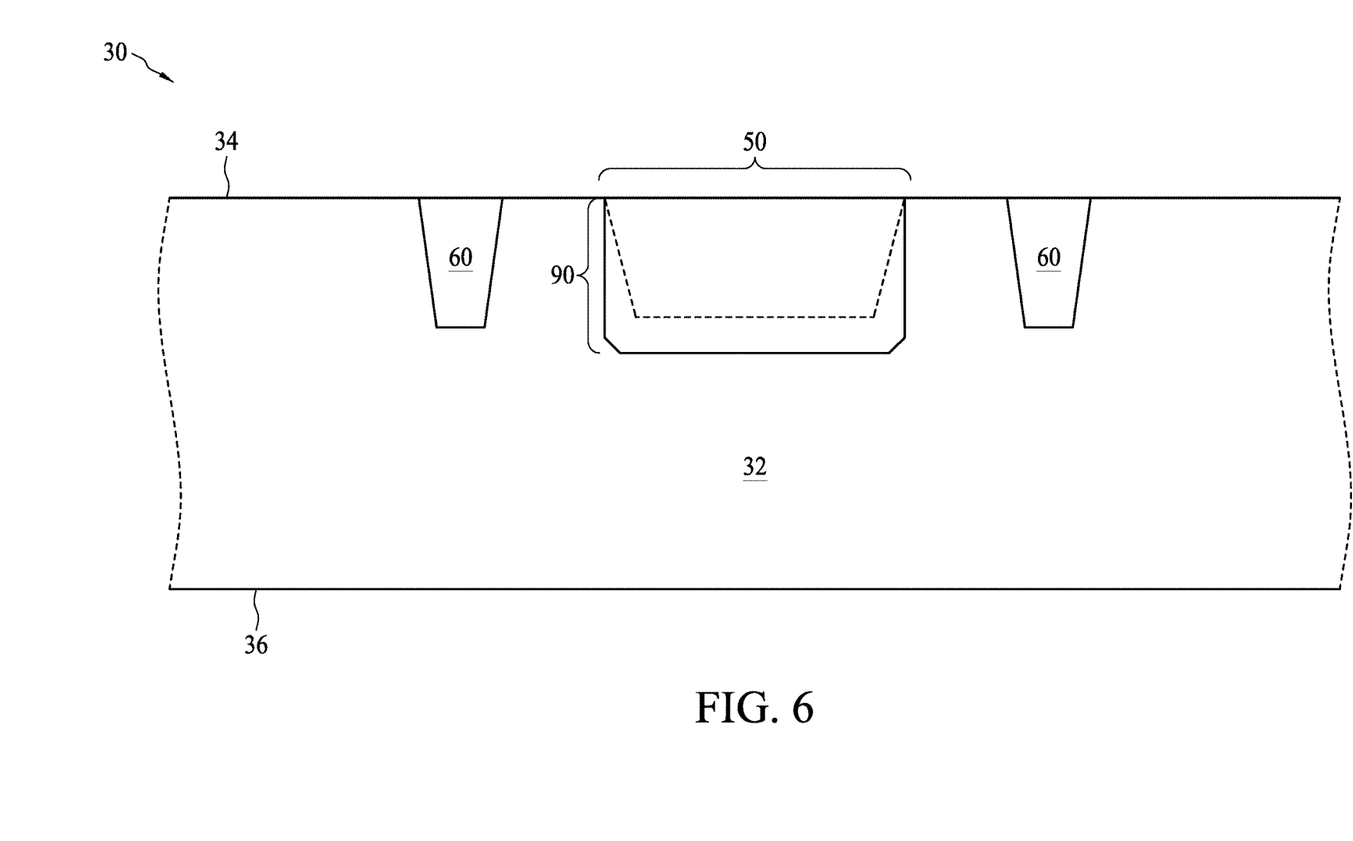

Referring to FIG. 6, the cavity 31' is filled with a semiconductor material to form a heterogeneous radiation-sensing region 90 adjacent to the front surface 34 of the substrate 32. In some embodiments, the filling may be performed subsequent to an annealing after the wet etching process. After the annealing, the temperature of the substrate 32 is reduced to a temperature suitable for epitaxially growing the semiconductor material, and an epitaxial growth is performed to grow the semiconductor material in the cavity 31'. A planarization process may be performed after the growth of the semiconductor material. In the exemplary embodiment, the semiconductor material is germanium. Alternatively, the semiconductor material could be another suitable semiconductor material. For example, the semiconductor material may be a group III-V material, such as GaAs. For another example, the semiconductor material may be a group II-VI material, such as ZnS.

The heterogeneous radiation-sensing region 90 is operable to sense or detect radiation waves projected toward the heterogeneous radiation-sensing region 90 through the back surface 36 of the substrate 32. The heterogeneous radiation-sensing region 90 may be intended to sense radiation waves having different wavelengths. A profile of the cavity 31 obtained after the dry etching process is denoted by dashed lines in FIG. 6 for easy comparison to the cavity 31'. As can be clearly seen in FIG. 6, a volume of the cavity 31' is greater than that of the cavity 31. Therefore, a volume of the heterogeneous radiation-sensing region 90, i.e., the semiconductor material filled in the cavity 31', can be increased, and the light sensing ability of the heterogeneous radiation-sensing region can be improved. Improvement in the light sensing ability may be approximately correlated to an increase in volume of the heterogeneous radiation-sensing region 90.

In some embodiments, isolation structures 60 may be formed in the substrate 32 to define approximate boundaries of each of the pixels. For example, the isolation structures 60 define the approximate boundaries of the pixel 50. The isolation structures 60 include shallow trench isolation (STI) features. The isolation structures 60 may alternatively include deep trench isolation features or doped isolation features. It is also understood that the isolation structures 60 may each include a suitable combination of STI features, deep trench isolation features, and doped isolation features.

In an embodiment where the isolation structures 60 are STI features or deep trench isolation features, the isolation structures 60 are formed by etching openings (or trenches) from the front surface 34 of the substrate 32 and thereafter filling the openings with a dielectric material, such as an oxide material, a nitride material, or combinations thereof. Although not illustrated for the sake of simplicity, the isolation structures 60 may each be surrounded by a doped well, which may have the same doping polarity as the substrate 32. Stated differently, if the substrate 32 is doped with a P-type dopant, then the doped wells are also doped with a P-type dopant, and vice versa. In another embodiment where the isolation structures 60 include doped isolation features, these doped isolation features may be formed by doping the substrate from the front surface 34 using a dopant that has a doping polarity opposite to that of the substrate 32.

Thus, if the substrate 32 is a P-type substrate, the dopant used to form the doped isolation features is an N-type dopant.

Figure 7:
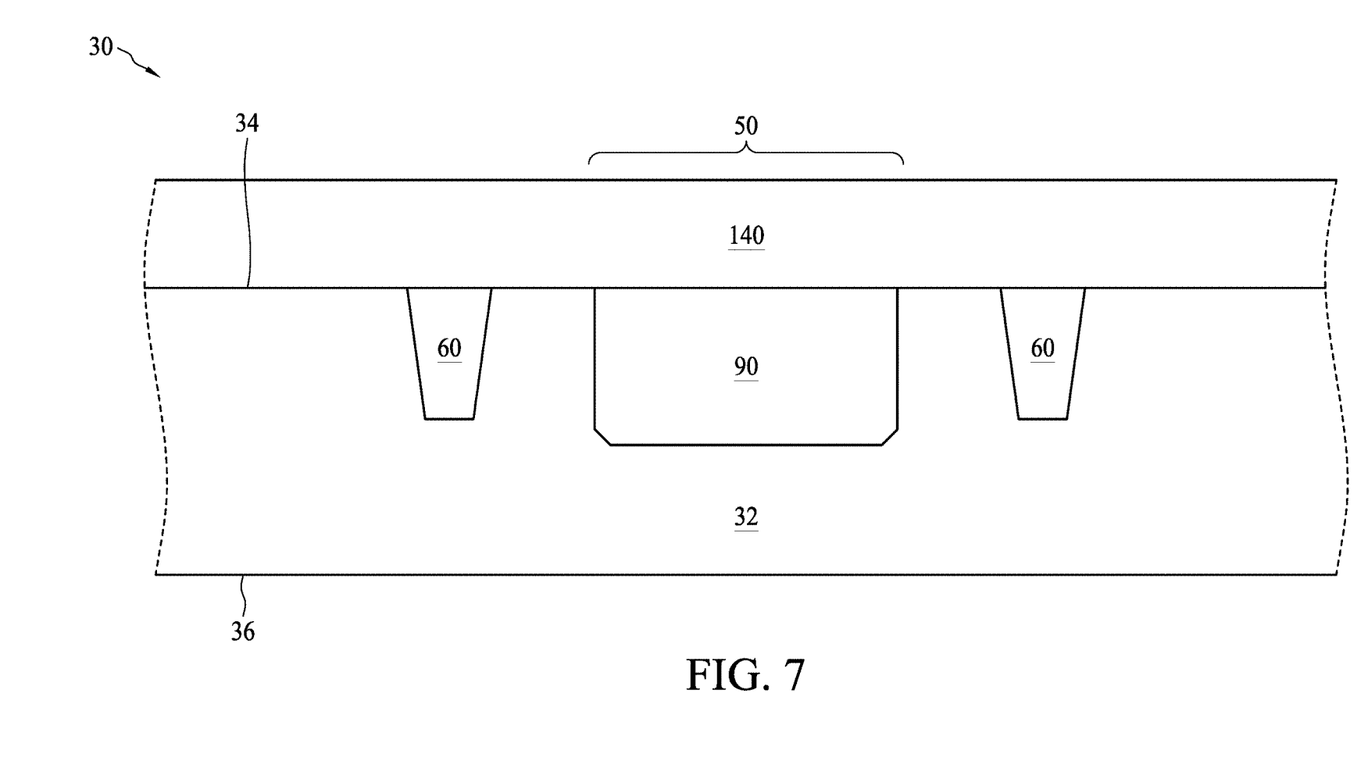

Referring to FIG. 7, an interconnect structure 140 is formed over the front surface 34 of the substrate 32. The interconnect structure 140 includes a plurality of patterned dielectric layers and conductive layers that provide interconnections (e.g., wiring) between the various doped features, circuitry, and input/output of the image sensor device 30. The interconnect structure 140 includes an interlayer dielectric (ILD) and a multilayer interconnect (MLI) structure formed in a configuration such that the ILD separates and isolates each MLI structure from other MLI structures. The MLI structure includes contacts, vias and metal lines formed on the substrate 32.

In one example, the MLI structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (PVD), chemical vapor deposition (CVD), or combinations thereof. Other manufacturing techniques to form the aluminum interconnect may include photolithography processing and etching to pattern the conductive materials for vertical connection (via and contact) and horizontal connection (conductive line). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect may be formed by a technique including CVD, sputtering, plating, or other suitable processes.

Thereafter, a thinning process (also referred to as a thin down process) may be performed to thin the substrate 32 from the back surface 36 to a suitable thickness. In an embodiment, the thinning process includes a CMP process. The thinning process may also include a diamond scrubbing process, a grinding process, or other suitable techniques. A substantial amount of material may be removed from the substrate 32 by the thinning process as shown in FIG. 7.

To facilitate the ensuing discussions, the substrate 32 is shown as being vertically flipped, or turned upside down. In other words, the substrate 32 is shown in FIG. 8 such that the back surface 36 is shown above the front surface 34.

Figure 8:
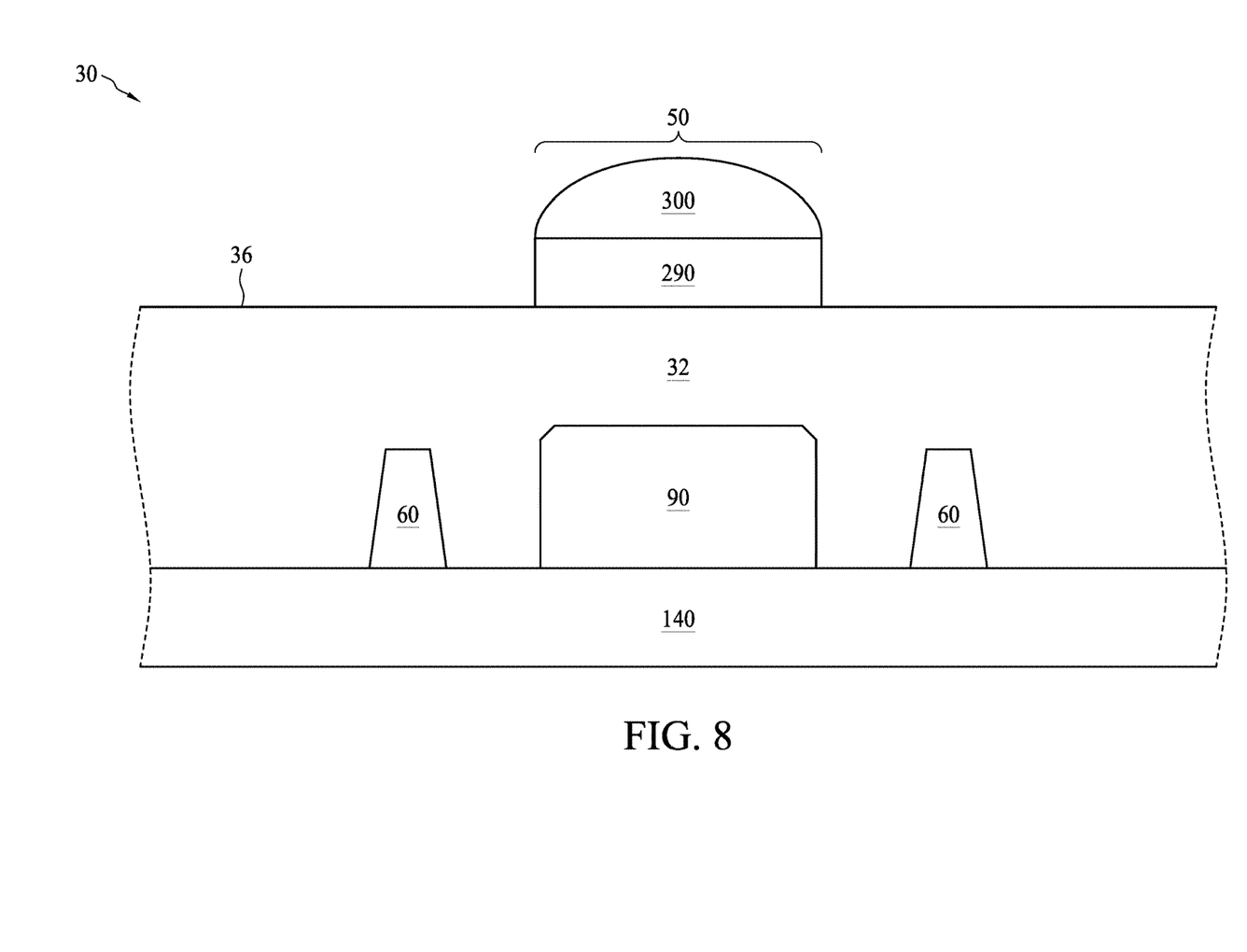

As shown in FIG. 8, a color filter 290 is formed over the substrate 32. The color filter 290 can support the filtering of radiation waves having particular ranges of wavelength. Thus, the color filter 290 may be used to allow only light having a predetermined color to reach the radiation-sensing region 90 therebelow. To achieve the filtering of specific ranges of wavelength, the color filter 290 may include a dye-based (or pigment based) polymer or resin. A micro lens 300 is then formed over the color filter 290. The micro lens 300 helps to direct projected radiation waves toward the heterogeneous radiation-sensing region 90 therebelow. The micro lens 300 may be positioned in various arrangements and may have various shapes depending on a refractive index of material used for the micro lens and depending on a distance from the surface of the BSI image sensor device 30.

Figure 9:
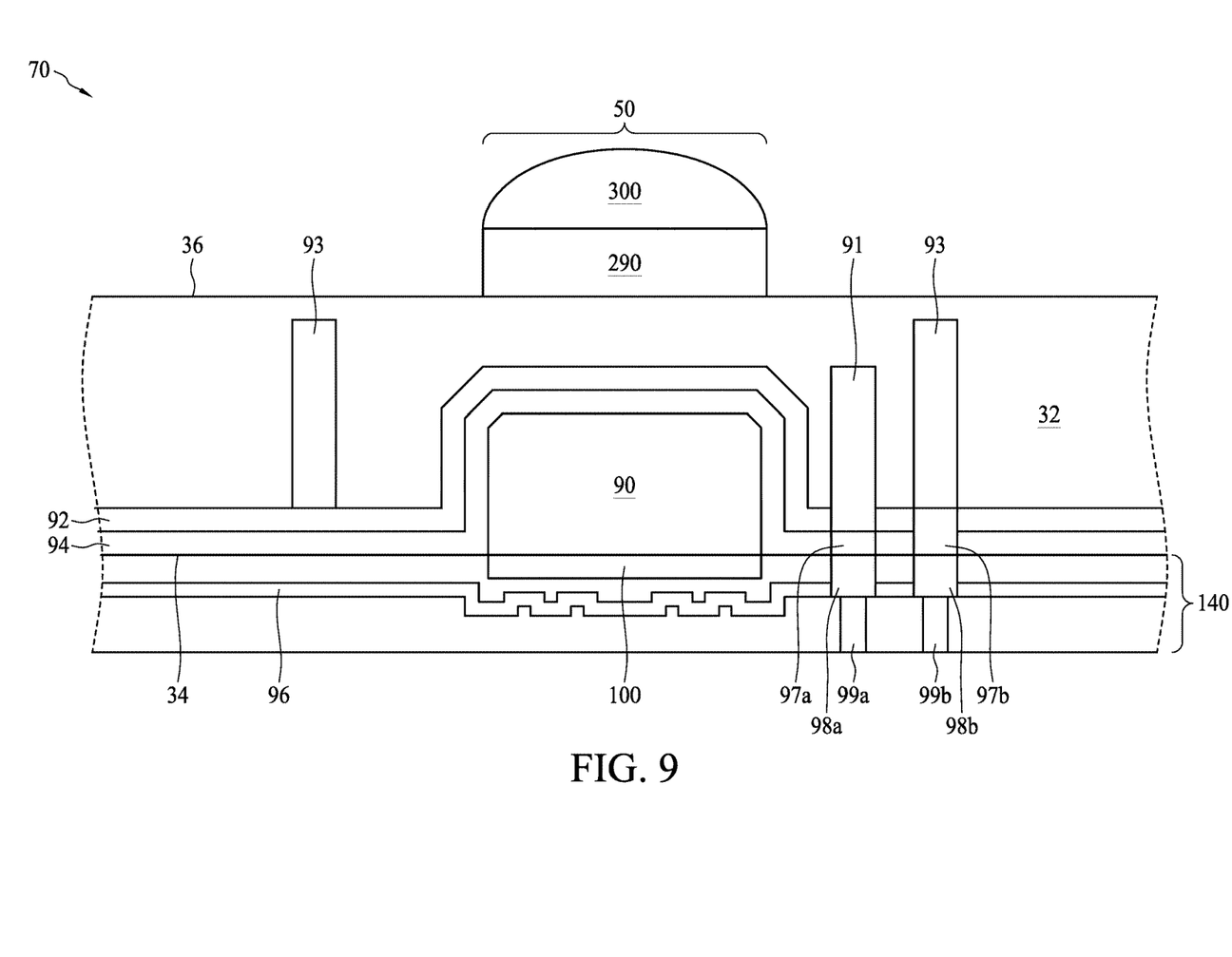
FIG. 9 is a diagrammatic fragmentary cross-sectional side view of a BSI image sensor device according to another embodiment of the present disclosure.

Referring to FIG. 9, illustrated a diagrammatic fragmentary cross-sectional side view of a BSI image sensor device 70 according to another embodiment with more details. It is understood that similar features in FIGS. 8 and 9 are numbered the same for the sake of simplicity and clarity. In FIG. 9, a layer doped with P-type impurity is referred to as a P-type layer 94, and a layer doped with N-type impurity is referred to as an N-type layer 92. The P-type layer 94 encompasses the sidewalls 33', the bottom 35' and the surfaces 37 of the cavity 31'. In addition, the P-type layer 94 is disposed between the substrate 32 and the interconnect structure 140 as well. The N-type layer 92 is disposed further between the P-type layer 94 and the substrate 32. Isolation structures 93 are formed in the substrate 32 to define approximate boundaries of the pixel 50. The isolation structures 93 are doped with N-type impurity in the embodiment. A region 91 doped with P-type impurity is disposed at a side the heterogeneous radiation-sensing region 90 between the isolation structures 93 and the heterogeneous radiation-sensing region 90. An amorphous silicon 100 is formed at the front surface 34 of the substrate 32 to at least overlap a portion of the heterogeneous radiation-sensing region 90 from a top view. In the embodiment, the amorphous silicon 100 fully overlaps the heterogeneous radiation-sensing region 90 from a top view. An etch stop layer 96 may be remained in the interconnect structure 140 during the formation process of vias 99a and 99b. One of the isolation structures 93 is coupled to the via 99b through contacts 97b and 98b. The region 91 is coupled to the via 99a through contacts 97a and 98a.

Some embodiment of the present disclosure provides a semiconductor structure, including: a semiconductor substrate including a front surface and a back surface; and a heterogeneous radiation-sensing region in the semiconductor substrate, the heterogeneous radiation-sensing region including a top surface, a bottom surface, and sidewalls, the top surface being adjacent to the front surface of the semiconductor substrate, the sidewalls being perpendicular to the front surface of the semiconductor substrate, and the bottom surface being parallel to the front surface of the semiconductor substrate.

Some embodiment of the present disclosure provides a semiconductor structure, including: a semiconductor substrate including a front surface and a back surface; a color filter arranged over the back surface of the semiconductor substrate; an optical lens arranged over the color filter; and a heterogeneous radiation-sensing region in the semiconductor substrate and adjacent to the front surface of the semiconductor substrate; wherein the semiconductor substrate has a crystal orientation allowing a cavity with a sidewall perpendicular to the front surface of the semiconductor substrate to be formed when the semiconductor substrate is wet etched at the front surface.

Some embodiment of the present disclosure provides a method for manufacturing a semiconductor structure, including: providing a semiconductor substrate having a front surface and a back surface; performing a dry etching process upon the front surface of the substrate to form a cavity with sidewalls not being perpendicular to the front surface of the substrate; performing a wet etching process upon the front surface of the substrate to further etch the sidewalls of the cavity to be perpendicular to the front surface of the substrate; and filling the wet etched cavity with germanium to form a heterogeneous radiation-sensing region.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure, comprising:
   a semiconductor substrate including a front surface and a back surface; and
   a heterogeneous radiation-sensing region in the semiconductor substrate, the heterogeneous radiation-sensing region including a top surface, a bottom surface, and sidewalls, the top surface being adjacent to the front surface of the semiconductor substrate, the sidewalls being perpendicular to the front surface of the semiconductor substrate, and the bottom surface being parallel to the front surface of the semiconductor substrate;
   wherein a facet of the semiconductor substrate adjacent to each of the sidewalls of the heterogeneous radiation-sensing region is in <111> direction.

2. The semiconductor structure of claim 1, wherein the heterogeneous radiation-sensing region includes a group III-V material or a group II-VI material.

3. The semiconductor structure of claim 1, wherein the heterogeneous radiation-sensing region includes germanium.

4. The semiconductor structure of claim 1, wherein the semiconductor substrate has a crystal orientation of (110).

5. The semiconductor structure of claim 1, wherein a facet of the semiconductor substrate adjacent to the bottom surface of the heterogeneous radiation-sensing region is in <110> direction.

6. The semiconductor structure of claim 1, wherein the heterogeneous radiation-sensing region further includes surfaces formed at boundaries of the bottom surface and the sidewalls.

7. The semiconductor structure of claim 6, wherein a facet of the semiconductor substrate adjacent to a surface of each of the surfaces is in <100> direction.

8. The semiconductor structure of claim 1, wherein a depth of the heterogeneous radiation-sensing region from the top surface to the bottom surface is greater than about 0 μm and less than about 10 μm.

9. A semiconductor structure, comprising:
   a semiconductor substrate including a front surface and a back surface;
   a color filter arranged over the back surface of the semiconductor substrate;
   an optical lens arranged over the color filter; and
   a heterogeneous radiation-sensing region in the semiconductor substrate and adjacent to the front surface of the semiconductor substrate;
   wherein the semiconductor substrate has a crystal orientation allowing a cavity with a sidewall perpendicular to the front surface of the semiconductor substrate to be formed when the semiconductor substrate is wet etched at the front surface;
   wherein a facet of the semiconductor substrate adjacent to each of the sidewalls of the heterogeneous radiation-sensing region is in <111> direction.

10. The semiconductor structure of claim 9, wherein the heterogeneous radiation-sensing region is square shaped in plan view and includes a top surface, a bottom surface and four sidewalls, the top surface being adjacent to the front surface of the semiconductor substrate, the sidewalls being perpendicular to the front surface of the semiconductor substrate, and the bottom surface being parallel to the front surface of the semiconductor substrate.

11. The semiconductor structure of claim 10, wherein the heterogeneous radiation-sensing region further includes surfaces formed at edges of the bottom surface.

12. The semiconductor structure of claim 9, wherein the heterogeneous radiation-sensing region includes germanium.

13. The semiconductor structure of claim 9, wherein the semiconductor substrate has a crystal orientation of (110).

14. The semiconductor structure of claim 11, wherein the bottom surface and a surface of each of the surfaces form an angle equal to 135 degrees.

15. The semiconductor structure of claim 14, wherein an extended plane of the bottom surface, a surface of each of the surfaces, and an extended plane of each of the sidewalls form an isosceles triangle having a right angle.

16. The semiconductor structure of claim 10, wherein a depth of the heterogeneous radiation-sensing region from the top surface to the bottom surface is in a range from about 1 μm to about 50 μm.

17. A semiconductor structure, comprising:
   a semiconductor substrate including a front surface and a back surface;
   a color filter arranged over the back surface of the semiconductor substrate;
   an optical lens arranged over the color filter; and
   a heterogeneous radiation-sensing region in the semiconductor substrate at the front surface of the semiconductor substrate, and sidewalls of the heterogeneous radiation-sensing region being perpendicular to the front surface of the semiconductor substrate;
   wherein a facet of the semiconductor substrate adjacent to each of the sidewalls of the heterogeneous radiation-sensing region is in <111> direction.

18. The semiconductor structure of claim 17, wherein the heterogeneous radiation-sensing region includes germanium.

19. The semiconductor structure of claim 17, wherein the heterogeneous radiation-sensing region includes a group III-V material or a group II-VI material.

20. The semiconductor structure of claim 17, wherein the semiconductor substrate has a crystal orientation of (110).

* * * * *